US010838661B1

United States Patent
Sharon et al.

(10) Patent No.: US 10,838,661 B1
(45) Date of Patent: Nov. 17, 2020

(54) FAST STORAGE CLASS MEMORY USING WRITE ONCE MEMORY CODING

(71) Applicant: Western Digital Technologies, Inc., San Jose, CA (US)

(72) Inventors: Eran Sharon, Rishon Lezion (IL); Ariel Navon, Revava (IL); Alex Bazarsky, Holon (IL); Idan Alrod, Kfar Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/397,993

(22) Filed: Apr. 29, 2019

(51) Int. Cl.
  *G06F 3/06* (2006.01)
  *G06F 12/02* (2006.01)
  *G11C 13/00* (2006.01)

(52) U.S. Cl.
  CPC .......... *G06F 3/0659* (2013.01); *G06F 3/0604* (2013.01); *G06F 3/0673* (2013.01); *G11C 13/0004* (2013.01); *G11C 13/0069* (2013.01)

(58) Field of Classification Search
  CPC .... G06F 3/0604; G06F 3/0659; G06F 3/0673; G11C 13/0004; G11C 13/0069
  See application file for complete search history.

(56) References Cited

U.S. PATENT DOCUMENTS

| | | | |
|---|---|---|---|
| 6,711,628 B1 | 3/2004 | Thelin | |
| 7,440,316 B1 | 10/2008 | Lee et al. | |
| 8,321,627 B1 | 11/2012 | Norrie et al. | |
| 8,671,327 B2 | 3/2014 | Litsyn | |
| 8,675,417 B2 | 3/2014 | Litsyn | |
| 8,799,559 B2 | 8/2014 | Sharon | |
| 9,070,453 B2 | 6/2015 | Sharon | |
| 2008/0037353 A1 | 2/2008 | Rajan et al. | |
| 2008/0266941 A1 | 10/2008 | Lee et al. | |
| 2011/0145486 A1* | 6/2011 | Owa | G06F 12/0246 711/103 |
| 2012/0117309 A1 | 5/2012 | Schuette | |
| 2012/0311262 A1* | 12/2012 | Franceschini | G06F 12/0802 711/118 |
| 2013/0080681 A1 | 3/2013 | Yaakobi et al. | |
| 2013/0086301 A1 | 4/2013 | Cleveland et al. | |
| 2013/0103891 A1 | 4/2013 | Sharon et al. | |
| 2013/0191594 A1 | 7/2013 | Cleveland et al. | |
| 2013/0238869 A1 | 9/2013 | Jones et al. | |
| 2014/0032822 A1 | 1/2014 | Oh | |
| 2014/0281121 A1 | 9/2014 | Karamcheti et al. | |
| 2017/0123662 A1* | 5/2017 | Sharon | G06F 3/0679 |
| 2018/0121134 A1* | 5/2018 | Schuster | G06F 11/1068 |

OTHER PUBLICATIONS

Palangappa et al., WOM-Code Solutions for Low Latency and High Endurance in Phase Change Memory, Apr. 2016, IEEE Transactions on Computers (Year: 2016).*

(Continued)

*Primary Examiner* — Larry T Mackall

(74) *Attorney, Agent, or Firm* — Rowan TELS LLC

(57) ABSTRACT

A memory with asymmetric command latency characteristics for WRITE operations utilizing WOM coding methodologies to reduce programming latency across a number of WRITE operations.

20 Claims, 13 Drawing Sheets

(56) References Cited

OTHER PUBLICATIONS

Eran Sharon, Idan Alrod, "Coding Scheme for Optimizing Random I/O Performance", SanDisk Corporation, Non-Volatile Memories Workshop 2013, Mar. 3-5, 2013; http://nvmw.eng.ucsd.edu/2013/program.
Eran Sharon, Idan Alrod, "Coding Scheme Optimizing Random I/O Performance", SanDisk Corporation, Non-Volatile Memories Workshop 2013, Mar. 3-5, 2013; Slides; http://nvmw.eng.ucsd.edu/2013/program.
International Search Report for PCT Application PCT/US2019/066932, dated Apr. 27, 2020.
J.K.Wolf, A.D.Wyner, J.Ziv, and J. Korner, "Coding for write-once memory", AT&T Bell Labs. Tech.J, vol. 63, No. 6, pp. 1089-1112, 1984.
Ling, K., Ju, L., Cai, X., & Jia, Z. (Aug. 2015). A Novel Memory Block Management Scheme for PCM Using WOM-Code. In 2015 IEEE 17th International Conference on High Performance Computing and Communications, 2015 IEEE 7th International Symposium on Cyberspace Safety and Security, and 2015 IEEE 12th International Conference on Embedded Software and Systems (pp. 296-301). IEEE. Ling, K.
R. L. Rivest and A. Shamir, "How to reuse a 'write-once' memory," Information and Control, vol. 55, pp. 1-19, 1982.
Written Opinion of the ISA for PCT Application PCT/US2019/066932, dated Apr. 27, 2020.

\* cited by examiner

FAST STORAGE CLASS MEMORY USING WRITE ONCE MEMORY CODING

BACKGROUND

Phase change memory technology is a promising candidates for implementing storage-class memory, also known as non-volatile memory. Devices incorporating non-volatile memory include solid state drives. A phase change memory allows for in-place writing at low granularity, e.g., at the bit level. Any bit can be independently reprogrammed with no need for a full memory block ERASE, as is the case with FLASH memory.

A phase change memory (e.g., FIG. 1) is an inherently asymmetric device where the RESET state transition from the crystalline material state (high current, low resistivity) to the amorphous material state (low current, high resistivity) is much faster than the opposite SET state transition from the amorphous material state to the crystalline material state (see FIG. 2). The SET state transition can typically have programming latency up to ~8 times longer than the RESET state transition.

During a WRITE memory operation to a phase change memory, the memory controller resets the bits within the written memory sector that need to change from 0 to 1, and sets the bits within the memory sector that need to change from 1 to 0. Hence overall, the WRITE memory operation involves both RESET operations and SET operations, incurring the latencies for both.

There is a general need for improvements to the average WRITE operation latency and programming throughput of phase change memory specifically, and more generally for any storage-class memory technology with asymmetric command latency characteristics.

BRIEF SUMMARY

This disclosure relates to memories with asymmetric command latency characteristics for WRITE operations, and methods to direct WRITE operations to memory sectors that utilize WRITE-Once Memory (WOM) coding. For example WRITE operations may be directed to particular memory sectors that utilize WOM coding based on a memory latency performance improvement target for those operations.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The asymmetric command latency characteristics of a phase change memory (PCM) may be exploited to significantly reduce the average WRITE operation latency and increase the programming throughput of the phase change memory (or any other memory technology with asymmetric command latency characteristics). The asymmetric command latency characteristics may be exploited using WRITE-once memory (WOM) coding. Throughout this description, particular examples are provided describing data lengths (four bits, eight bits etc.) at various stages of processes. These particular examples are non-limiting and other data lengths are also applicable. The terms "dedicated" or "particular" may also be used to refer to memory sectors to indicate that the memory sectors are configured (assigned) for a particular purpose or treatment.

The latency of a SET operation may be significantly longer (~8× longer) than the latency of a RESET operation. Hence, if a phase change memory WRITE operation involves mostly RESET operations and fewer SET operations, then the average phase change memory WRITE operation latency may be significantly lower than otherwise.

Figure 4:
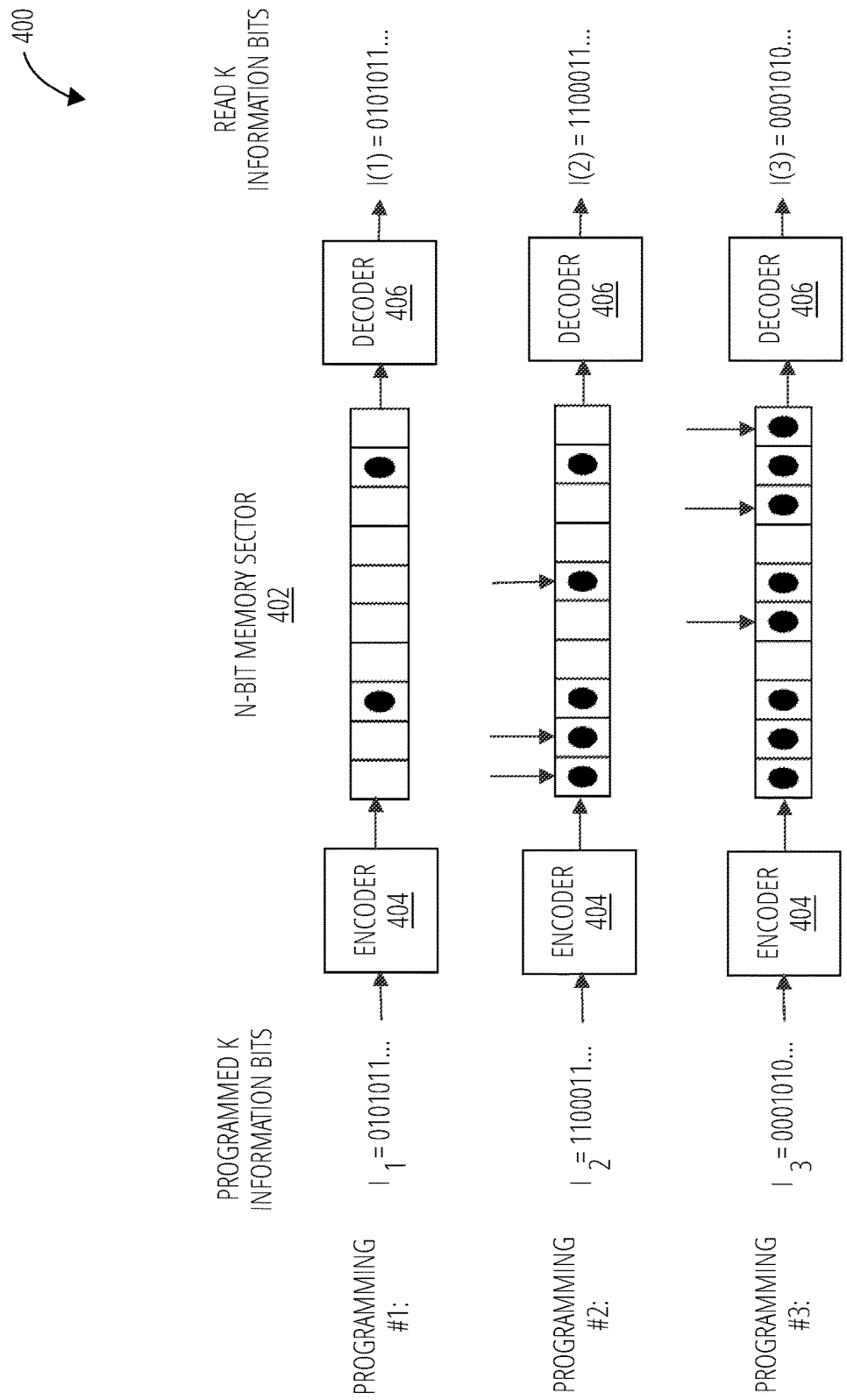
FIG. 4 illustrates a programming method 400 in accordance with one embodiment.

To achieve this scenario, in one scenario, a memory sector may be first SET to all 0's. For each WRITE operation, a RESET operation may be performed on some of the bits in the memory sector to set them to 1's. This may be done by WOM coding data into the memory sector locations, and setting the 1's of this encoded data using the RESET operation. An example of this process is illustrated in FIG. 4. At some point, when the memory sector contains a large fraction of 1's and it cannot support additional WRITE operations, the memory sector may be set back to all 0's in order to perform the next WRITE operations.

Likewise, in another scenario, a memory sector may be initialized to all "1"s using RESET operations. The WOM coding may then seek to minimize a number of "0"s for the encoding of data from WRITE operations into the sector. Herein, "minimize" does not necessarily mean achieving an absolute theoretical minimum, but rather means to reduce the number to a relatively low level compared to what it would be without encoding applied. The term "memory sector" refers to any set of memory locations, typically but not necessarily a continuous range of addresses.

On average, t writes on a memory sector may be carried out this way, such that each WRITE operation on the memory sector involves resetting some additional bits to 1's before the need to SET the memory sector back to all 0's. Then the average write latency is given by:

$$L = \frac{(L_{Set} + L_{Reset}) \cdot 1 + L_{Reset} \cdot (t-1)}{t} \qquad \text{Equation 1}$$

where $L_{Set}$ and $L_{Reset}$ are the SET operation and RESET operation latencies, respectively.

The memory sector programming speedup factor of this approach compared to a conventional approach is given by:

$$SpeedUp = \frac{t \cdot (L_{Set} + L_{Reset})}{(L_{Set} + L_{Reset}) \cdot 1 + L_{Reset} \cdot (t-1)} \quad \text{Equation 2}$$

$$= \frac{t + t \cdot \frac{L_{Set}}{L_{Reset}}}{t + \frac{L_{Set}}{L_{Reset}}}$$

The approach may utilize WOM coding. The overprovisioning required in order to write k bits into n memory cells t times, assuming an optimal WOM coding, is provided in the following table for several values of t:

TABLE 1

| t | Overprovisioning (n/k) |
|---|---|
| 1 | 1 |
| 2 | 1.294 |
| 3 | 1.549 |
| 4 | 1.783 |
| 5 | 2.003 |
| 10 | 2.983 |

Figure 5:
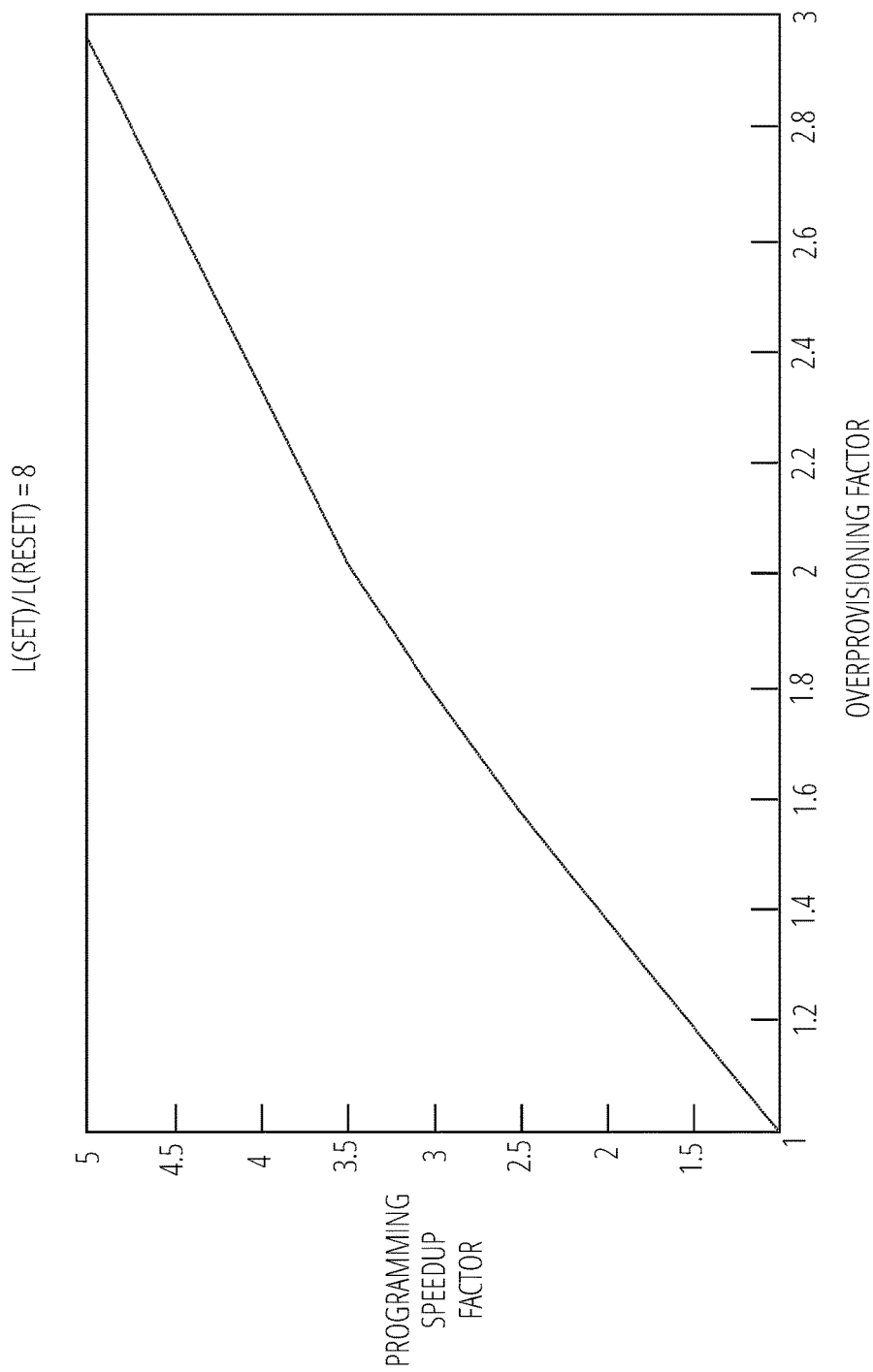
FIG. 5 illustrates a programming speedup based on over-provisioning 500 in accordance with one embodiment.

Combining the achievable programming speedup factor as a function of the number of WRITE operations t supported by a WOM coding (Eq. 1) and the overprovisioning required to support t WRITE operations by a WOM coding, the expected programming speedup factor may be derived as a function of the overprovisioning factor, as shown in the graph of FIG. 5. For example, an overprovisioning factor n/k=2 may yield a programming speedup factor of ~3.46.

One embodiment of this approach may utilize a fast phase change memory partition. A tradeoff may be made between the overprovisioning that is allocated to the fast phase change memory partition and the programming speedup factor of the fast partition as compared to a regular partition.

An alternative approach may be to opportunistically leverage the inherent overprovisioning of the host device data, without "paying" for overprovisioning in the phase change memory. In this case, the memory controller may attempt to compress each memory sector prior to programming the memory sector, and may apply an opportunistic (apply or not based on the efficiencies gained) WOM coding on the memory sector as a function of the available overprovisioning after compression.

WOM coding involves writing "shaped" data having a small fraction of 1's. The memory controller may implement direct data shaping using WOM coding instead of first compressing and then shaping the data.

In the opportunistic approach (which does not utilize guaranteed overprovisioning), it may be desirable to segregate the host device data into separate partitions according to the compressibility ratio (or shaping level or entropy level) of the host device data, in order to obtain a higher programming throughput gain. For example, all non-compressible host device memory sectors (or host device sectors not satisfying some threshold level of compression) may be stored in one partition, and all highly-compressible host device sectors may be stored in a second partition. The non-compressible memory sectors may incur the nominal programming latency $L_{Set} + L_{Reset}$. Highly compressible memory sectors may instead incur a reduced programming latency according to their average compressibility ratio, according to Equation 1 above.

The compressibility ratio may determine the average number of writes t that can be supported by the WOM coding before a SET operation needs to be performed on the sector. Thus the host device data may be partitioned according to its compressibility ratio or shaping level.

The opportunistic approach may track the partition in which each host device memory sector is stored according to one or more of its compressibility ratio, shaping level, or entropy level. A storage class memory may typically not maintain memory address translation tables. In order to track the placement of each memory unit to one of the shaping-based partitions, and to facilitate access during READ operation, several embodiment options may be available.

One such option may be host shaping management. The host device may indicate the proper shaping level for each memory unit and may choose the memory address of the memory unit such that it resides in the corresponding partition. Another option may be dual read. Once a READ operation is received, relevant shaping-based partitions may be accessed at the corresponding memory address, and the correct one may be chosen. Using this method, the header may keep the logical block address (LBA) to compare. Additionally, the host device memory address space may be reduced by the number of partitions. This may be a suitable tradeoff for shorter read and write latencies in some embodiments. Another option may be speculative serial read. The first read may be either random or estimated. Estimation may be based on the most frequent lately, on the LBA regions tracking table, etc.

In a system utilizing host shaping management, the host device may choose the partition in which data resides according to the data's entropy, taking into account the data's eventual shaping. The shaping itself may be conducted either in the memory controller or in the host device. The data may be written to memory by the storage memory controller at increased speed.

Figure 1:
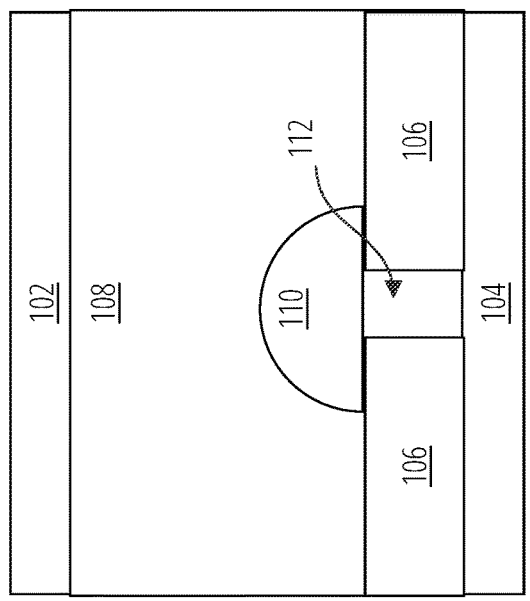
FIG. 1 illustrates a phase change memory cell 100 in accordance with one embodiment.

FIG. 1 illustrates a phase change memory cell 100 in one embodiment. The phase change memory cell 100 comprises a top electrode 102, a bottom electrode 104, and a phase change material 108.

Electric current passes from the top electrode 102 to the bottom electrode 104 by way of a heater region 112, between regions of insulator 106. The electric charge from the top electrode 102 is funneled into the heater region 112 by the insulator 106, causing the heater region 112 to heat up. This creates a phase change in the phase change material 108 forming a programmed region 110.

Figure 2:
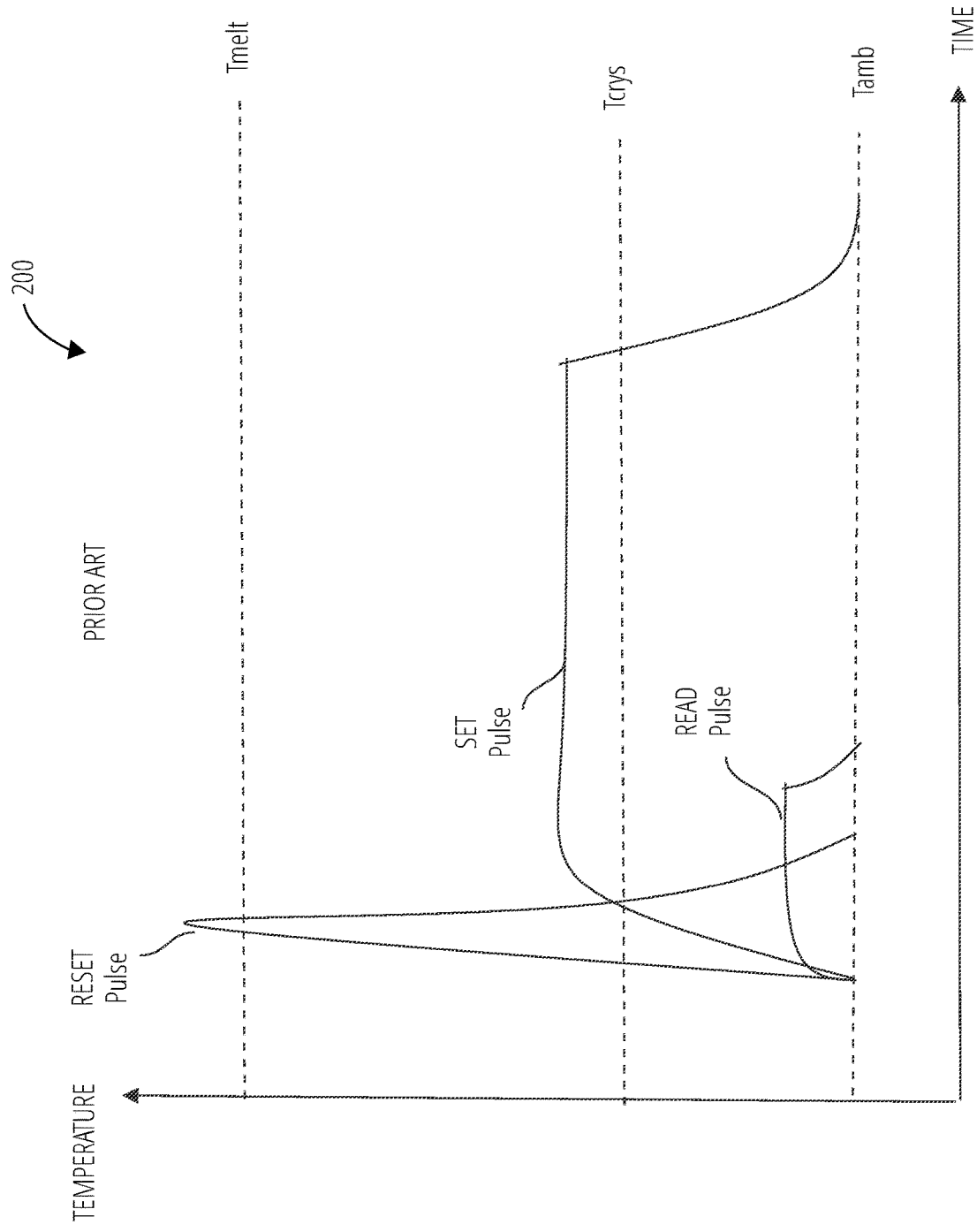
FIG. 2 illustrates control signals 200 in accordance with one embodiment.

FIG. 2 illustrates exemplary control signals 200 to program (set), read, and reset a phase change memory cell 100. The READ pulse may not have sufficient voltage or current to heat the phase change material to a temperature that induces a phase change. During READ pulses, the temperature in the phase change material may rise above ambient temperature ($T_{amb}$), but may not be elevated to a level which affects the material structure, whether it is in an amorphous state or a crystalline state.

The phase change material exhibits switching characteristics near the threshold voltage $V_{th}$. Below $V_{th}$ the phase change material exhibits high resistance, and switches to a low-resistance, conductive state at or slightly above $V_{th}$. At the point above $V_{th}$ where the resistance drops, a higher current flow is possible, which may allow the phase change material to reach a higher temperature more quickly. A RESET pulse above $V_{th}$, therefore, may allow enough current flow to quickly bring the temperature of the phase change material to above $T_{melt}$, as shown. At this temperature, it may not take long for the material to melt and the atoms to disarrange into an amorphous state.

A SET pulse at a voltage below $V_{th}$ may induce the phase change material temperature to elevate above $T_{crys}$, but may not allow enough current to rise as high as $T_{melt}$. This temperature range may encourage a slower atomic rearrangement, allowing the atoms to form crystals. Thus, with the temperature elevated above $T_{crys}$, material in an amorphous state may transition to a crystalline state, but the atoms may take longer to form their crystal structure than they do to melt into an amorphous state. Thus the SET pulse may need to be sustained for significantly longer than the RESET pulse.

Figure 3:
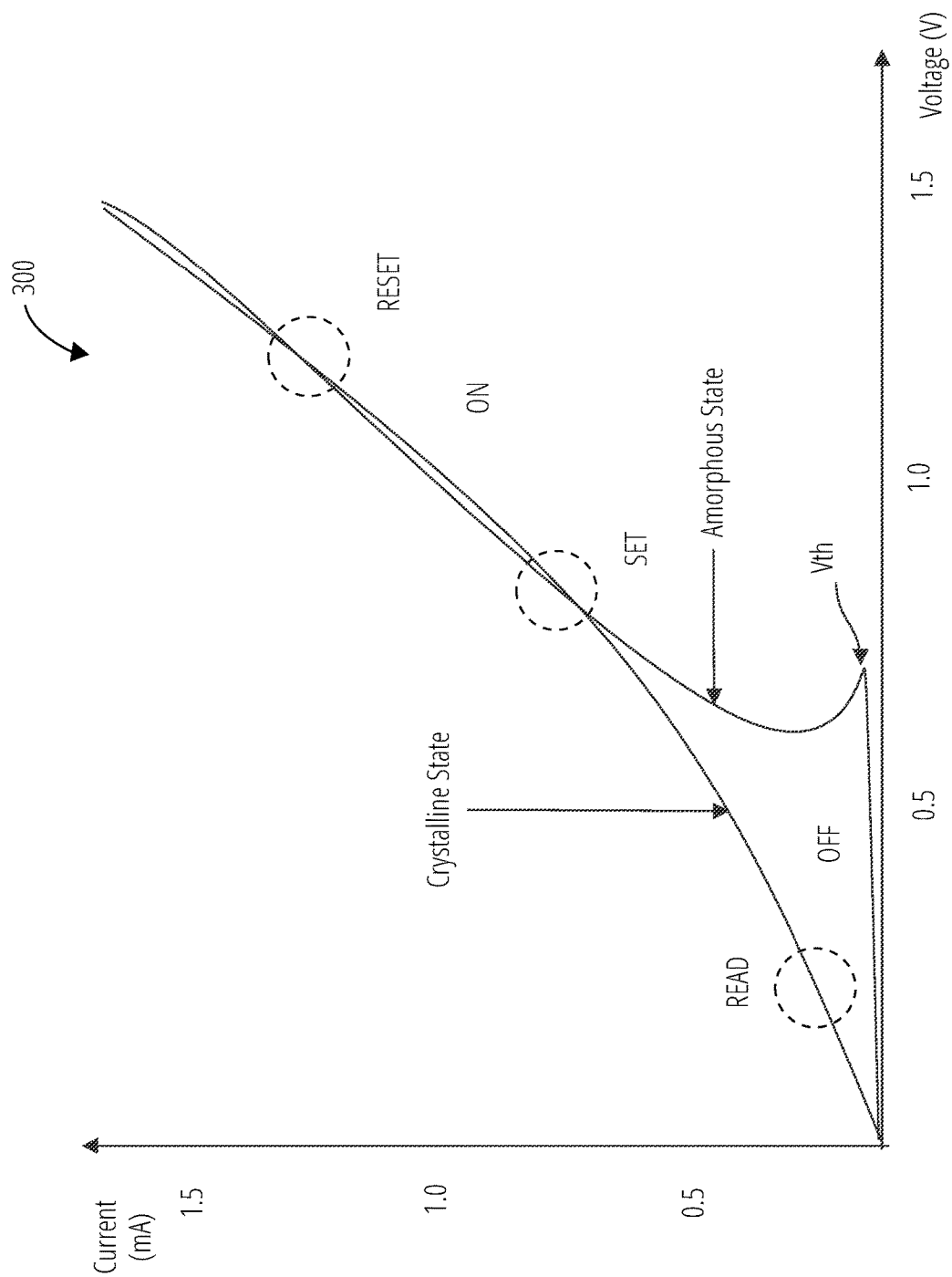
FIG. 3 illustrates SET state and RESET state characteristics 300 in accordance with one embodiment.

FIG. 3 illustrates a SET state and RESET state characteristics 300 in one embodiment. The crystalline lattice structure of the phase change material undergoes operationally distinct transformations (A state, B state, C state, and D state in this example) above the threshold voltage depending on the magnitude of the current applied. At each state the phase change material exhibits a different resistivity factor. Such phase change materials may be formed for examples using combinations of the elements Ge, Sb, and Te.

As with binary state phase change materials, it takes the longest to transition past the threshold voltage to the first (A) state (analogous to the SET state for a binary state phase change material). From the A state other states can be programmed by applying current pulses of successively higher amplitude.

FIG. 4 illustrates a programming method 400 that utilizes WOM coding to modify an n-bit memory sector 402. Prior to programming the memory sector 402 may be SET to all 0's (where the SET cells are illustrated as "empty" cells on FIG. 4). During a first programming (memory WRITE operation), the encoder 404 may transform the programmed K information bits ($I_1$) into an n-bit string that may be represented by "1" bits programmed using RESET operations only, in the third and ninth positions of the n-bit memory sector 402 (where the RESET cells are illustrated as the memory cells with black dots on FIG. 4). This pattern may be decoded at the decoder 406 and read back as the original K bits.

During a second programming (WRITE operation) to the n-bit memory sector 402, the encoder 404 may choose a pattern to represent the new K bits ($I_2$) that incorporates knowledge of the bits already encoded into the n-bit memory sector 402. As is shown by the arrows, a pattern may be chosen that programs to "1" (using RESET) the bits at the first, second, and sixth positions of the n-bit memory sector 402.

During a third programming, a new pattern may be chosen taking into account all the bits already encoded in the n-bit memory sector 402, and may program three additional "1" bits. At this point, there may only be two "open" positions available, and the ability to further encode data into the n-bit memory sector 402 may be exhausted.

WOM coding of this nature may be used on PCM to take advantage of the faster RESET operation to lower overall latency by performing more RESET operations than SET operations, where possible.

FIG. 5 depicts programming speedup based on overprovisioning 500. Greater benefit in programming speed that may be gained by overprovisioning the phase change memory on which WOM coding is used. For example if the n-bit memory sector 402 stored 20 bits, rather than 10 bits, successive K-bit data strings may be encoded by adding two or three additional encoded bits for each WRITE, thus gaining more programming cycles before the n-bit memory sector 402 needs to be SET (programmed to all "0" s). In a similar manner, applying WOM coding to a memory sector that is larger than necessary may allow for additional degrees of freedom that allow more programming operations to be performed on the memory sector before SET of the memory is needed.

In FIG. 5, the overprovisioning factor is depicted along the horizontal axis. The overprovisioning factor represents the amount of memory provisioned over the amount of memory used for storing programmed data. For example, if the data to be programmed comprises 128 bits, setting aside 256 bits results in an overprovisioning factor of 2.

Assuming $L_{Set}$ takes eight times longer than $L_{Reset}$, as may be typical with PCM, programming may be sped up (latency reduced) by the factor represented along the vertical axis. As depicted, overprovisioning by a factor of two may result in an average programming speed that is approximately 3.5 times faster than it would be with no overprovisioning.

Some embodiments may partition off a subsection of the available memory to be used for higher speed data transfer. This partition may use overprovisioning to improve latency. Data compression and shaping, discussed in more detail below, may allow data to be compressed to a smaller number of bits to generate some amount of "built in" overprovisioning without impacting the usable memory capacity (see FIG. 11 for an example of the achievable lowest fraction of 1's in the programmed bit sequence in case the host data is 50% compressible).

Figure 6:
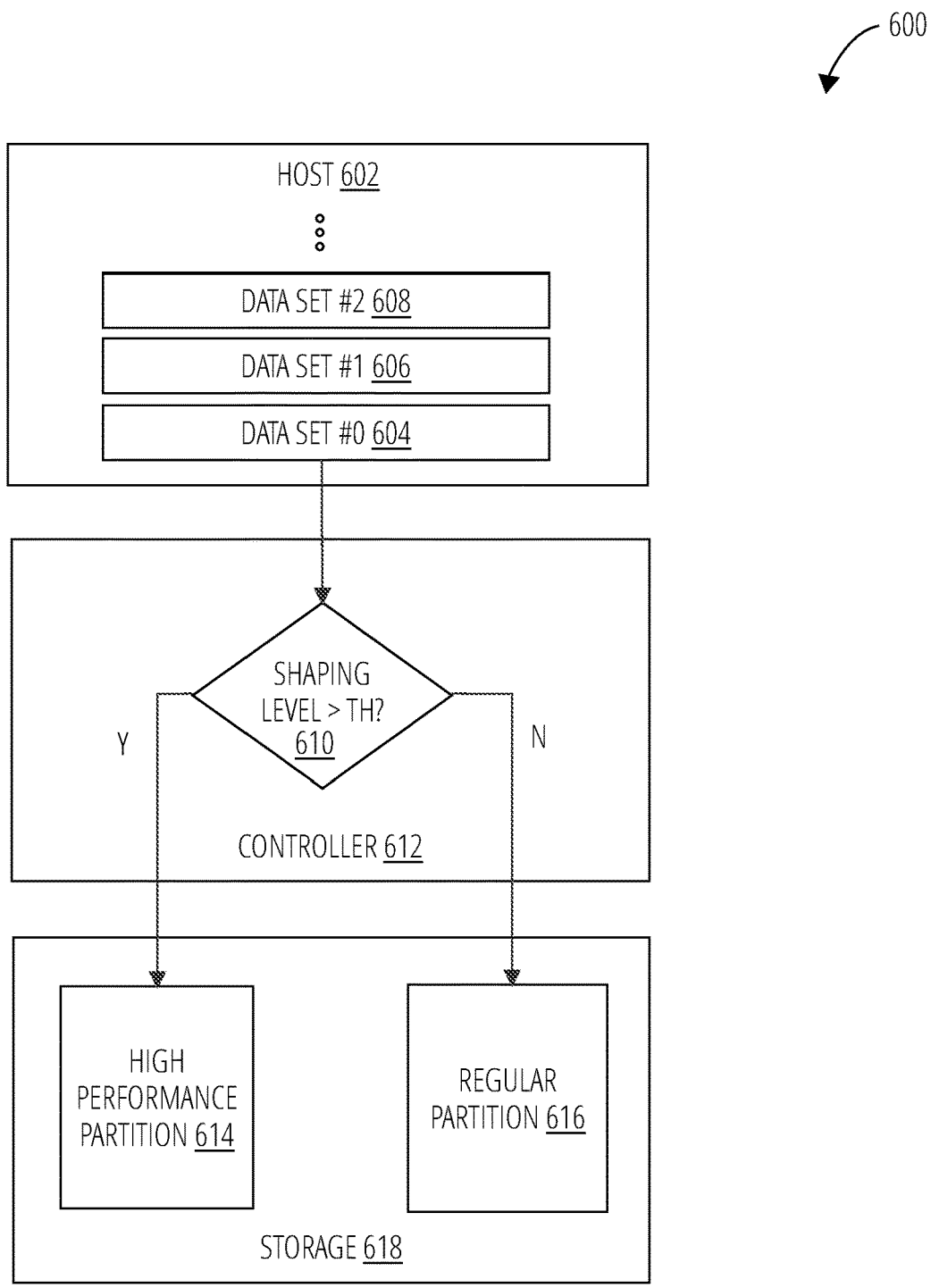
FIG. 6 illustrates a shaping-based partition selection process 600 in accordance with one embodiment.

FIG. 6 illustrates a shaping-based partition selection process 600. This process may be implemented on a memory system comprising a host 602, a controller 612, and storage 618 that includes a high performance partition 614 and a regular partition 616. The high performance aspects of the high performance partition 614 may be facilitated by the overprovisioning discussed above. Alternately, data sets to be written to memory may be assessed for how much shaping of the data may be possible. This may be referred to as an opportunistic approach. Data that may be compressed, shaped, and otherwise represented by a threshold number of 0s (or 1's, depending on the implementation) has a high opportunity for shaping.

The host 602 may send data sets to be written to storage 618 (shown as data set #0 604, data set #1 606, and data set #2 608). The controller 612 may assess each data set to determine whether or not the shaping level that may be applied to the data set is above or below a certain threshold (TH) (decision step 610). Data sets that may be shaped to a level above TH may be shaped and written to the high performance partition 614. The high performance partition 614 may be a dedicated memory partition that is configured to facilitate WRITE operations with minimal programming latency, and thus high speed performance. Data set that may not be shaped to a level above TH may be written to the regular partition 616, as they may not provide the requisite level of efficient to warrant the use of WOM coding methods to reduce latency.

In implementing an opportunistic approach to data shaping, the partition to which each data set is written (according to its compressibility/shaping/entropy level) may be tracked. The memory system may not keep address translation tables, so to track the placement of each data set to one of the shaping-based partitions, one or more of the following methods may be utilized in various embodiments.

Host shaping management is the first method. The host may indicate the proper shaping level for each data set and choose the address of the data set such that it resides in the corresponding partition. Dual read is another method. Once a read command is received, all relevant shaping-based partitions may be accessed at the corresponding address, and the correct location chosen. To utilize this method, the header of the READ sector may maintain the LBA for comparison purposes. The host address space may be reduced by the number of high-performance partitions. This may be a suitable tradeoff for shorter read and write latencies. Speculative serial read is another method. The first guess as to the memory location likely to be read may be random, or may be estimated based on recent frequency of reads, on the LBA region's tracking table, and other techniques known in the art.

Figure 7:
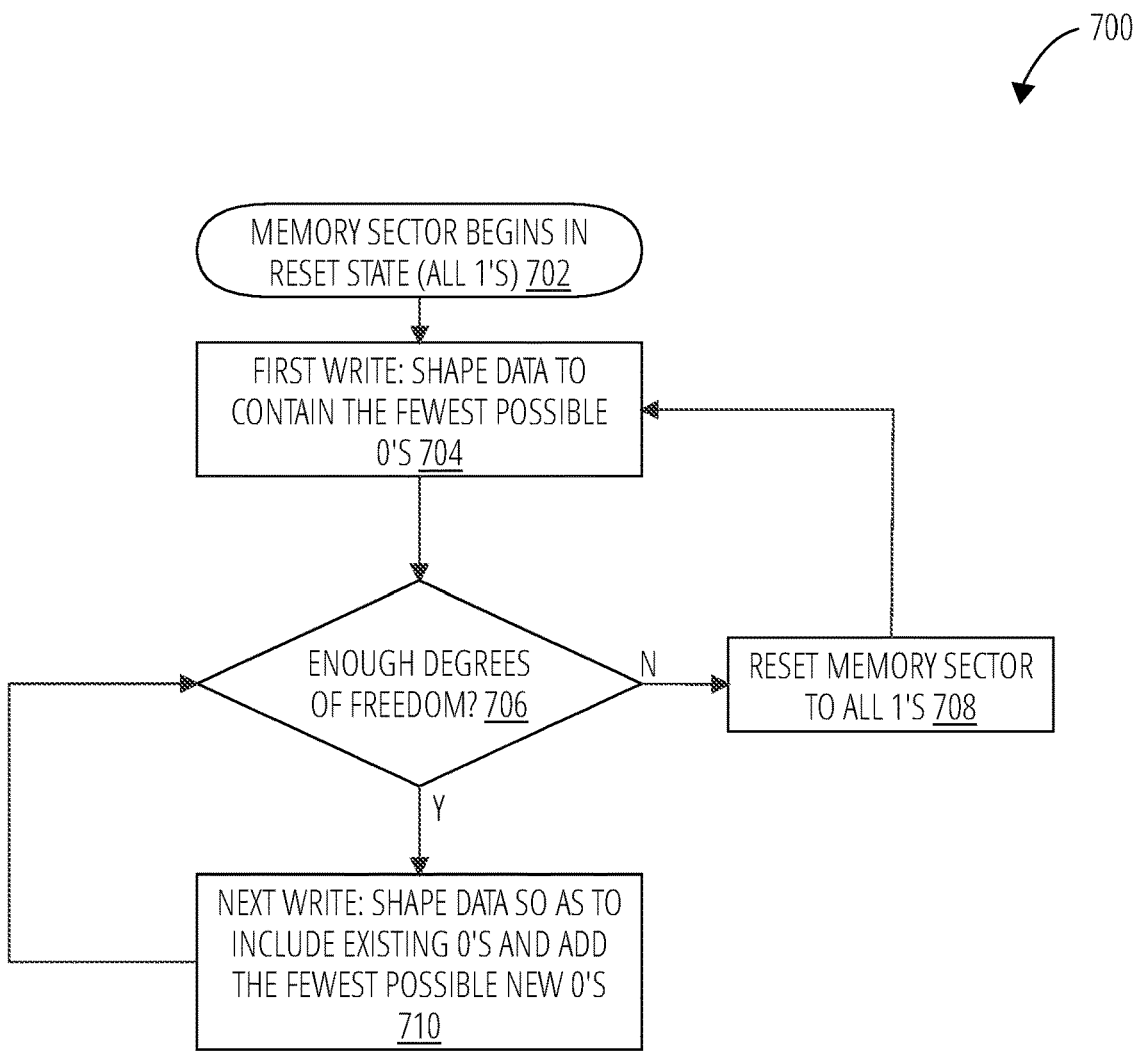
FIG. 7 illustrates a WOM with shaping process 700 in accordance with one embodiment.

FIG. 7 illustrates a WOM with shaping process 700. The WOM with shaping process 700 may start at block 702 with all bits of the memory sector in the RESET state (all 1's). Because SET pulses are used (in this example) to write 0's, and take much longer than RESET pulses, the first write, in block 704, may include shaping the data to use as few 0's as possible.

The memory sector may be evaluated in decision step 706 to determine whether enough degrees of freedom (bits still in RESET state) remain for subsequent writes to occur. If enough degrees of freedom remain, the next write may be performed at block 710. This write may require shaping the data such that existing 0's are not overwritten, and as few additional 0's are written as possible.

The decision step 706 evaluation may be performed again. If there are no longer enough degrees of freedom remaining, the entire memory sector may be RESET to all 1's in block 708, and the first write of the newly RESET memory sector may be performed (block 704).

Figure 8:
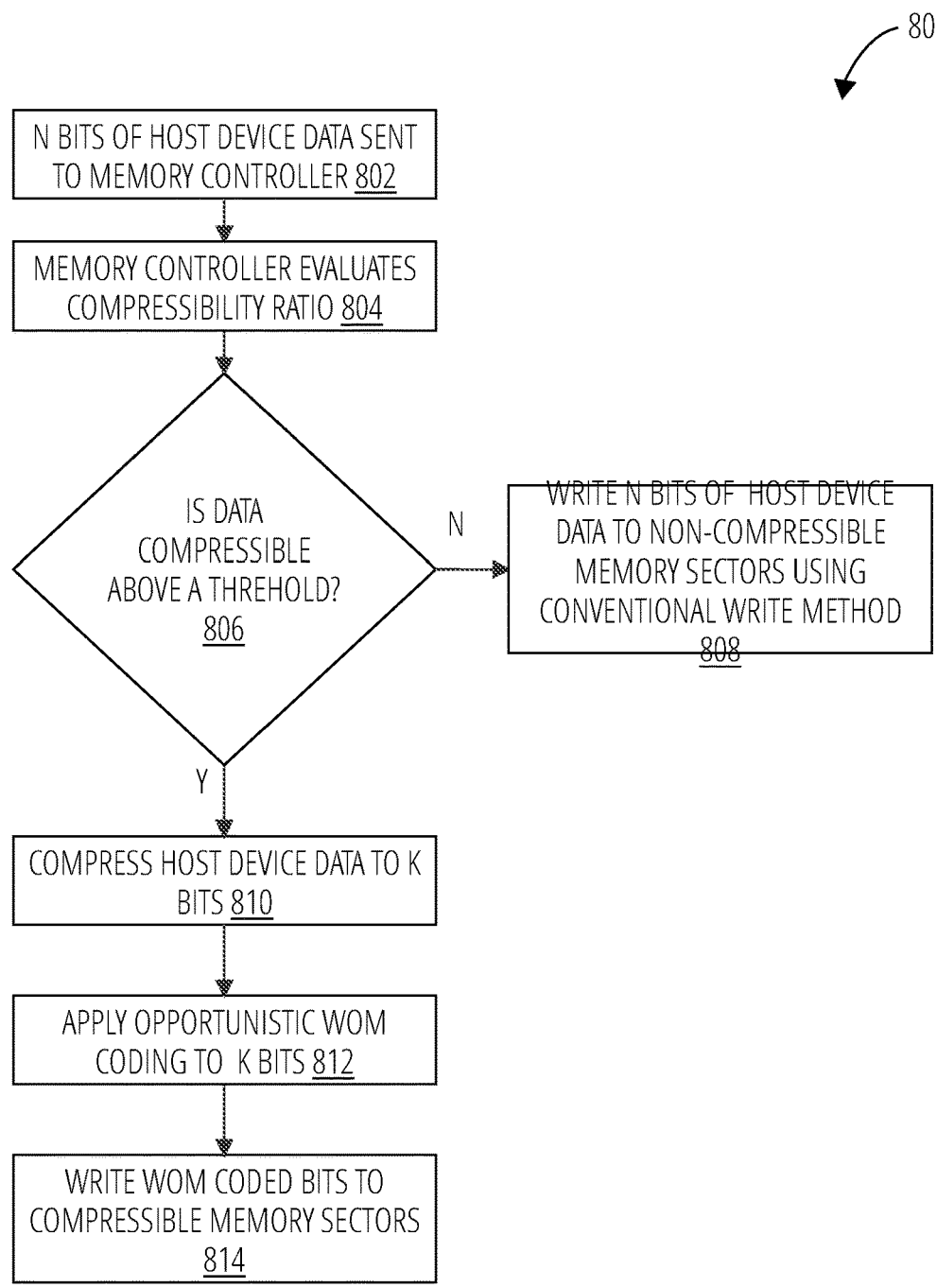
FIG. 8 illustrates a write operation process 800 in accordance with one embodiment.

FIG. 8 illustrates a write operation process 800 that may be used for memory partitioned to create a high-speed set of compressible memory sectors and a set of non-compressible memory sectors, where conventional WRITE operations may be employed.

In block 802, n bits of host device data may be sent to the memory controller. The memory controller may evaluate the data's compressibility ratio in block 804. If the data is determined to not be compressible beyond a threshold level in decision step 806, the n bits of host data may be written to non-compressible memory sectors using a conventional write method.

If the data is determined to be compressible at decision step 806, the memory controller will compress the n bits of data to k bits (block 810). The k bits will have opportunistic WOM coding applied (block 812) in order to shape the data to include as few 0's as possible. The shaped k bits of data may be written (e.g., after expansion back into n bits due to the shaping) to compressible memory sectors (block 814). The compressible memory sectors may employ the process illustrated in FIG. 7 to reduce latency across many WRITE operations.

If the data is determined to be non-compressible in decision step 806, the n bits of host device data may be written to non-compressible memory sectors using conventional WRITE operations (block 808).

Figure 9:
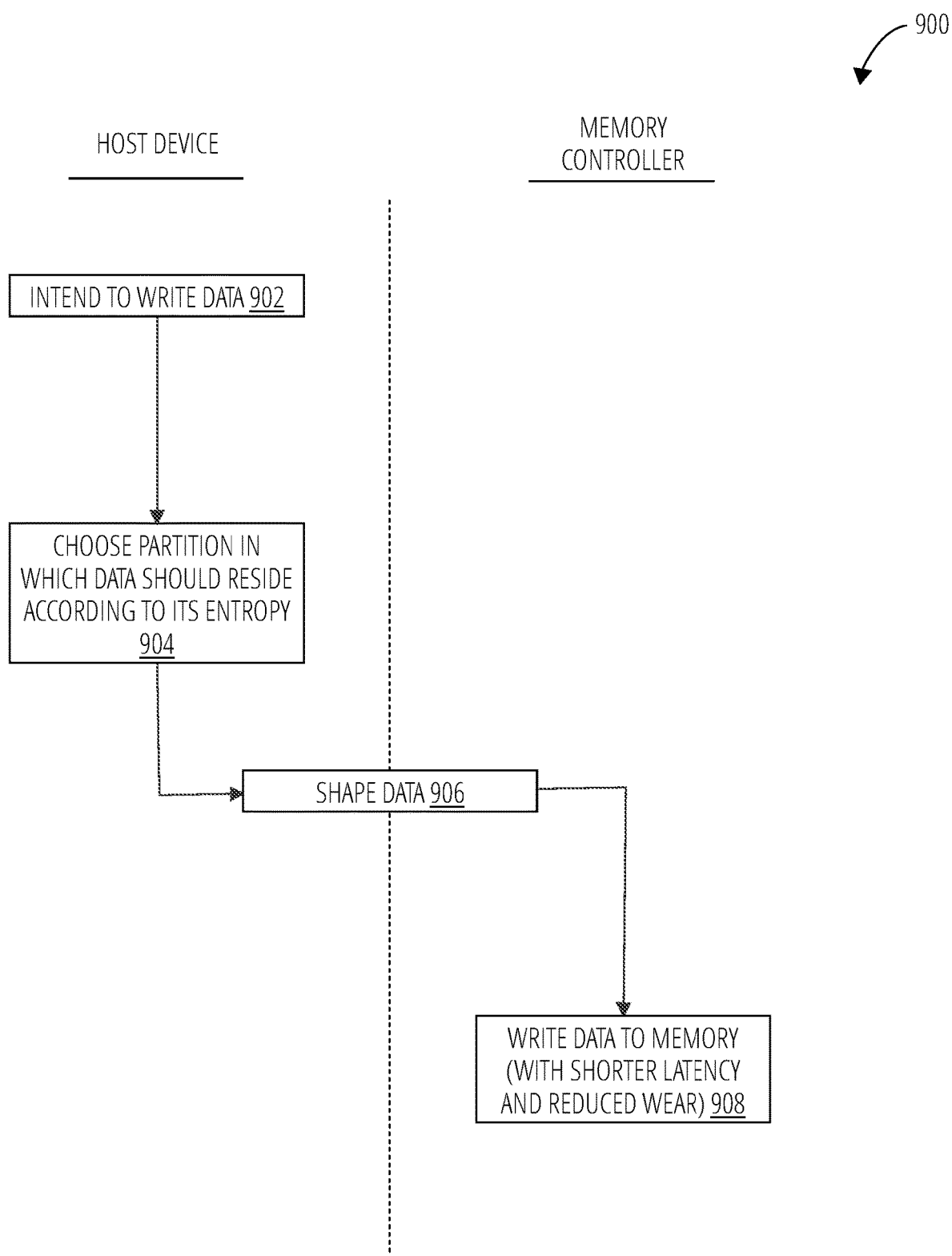
FIG. 9 illustrates a write operation process division 900 in accordance with one embodiment.

FIG. 9 illustrates the write operation process division 900, indicating which tasks may be performed by the host device and which by the memory controller in one embodiment. The host device may identify data intended to be written to memory in block 902. The host then chooses the partition in which data is to reside according to its entropy, taking into account its eventual shaping, in block 904.

The shaping performed in block 906 may be done either by the host device or the memory controller. Finally, the data is written to memory by the storage controller in block 908.

Figure 10:
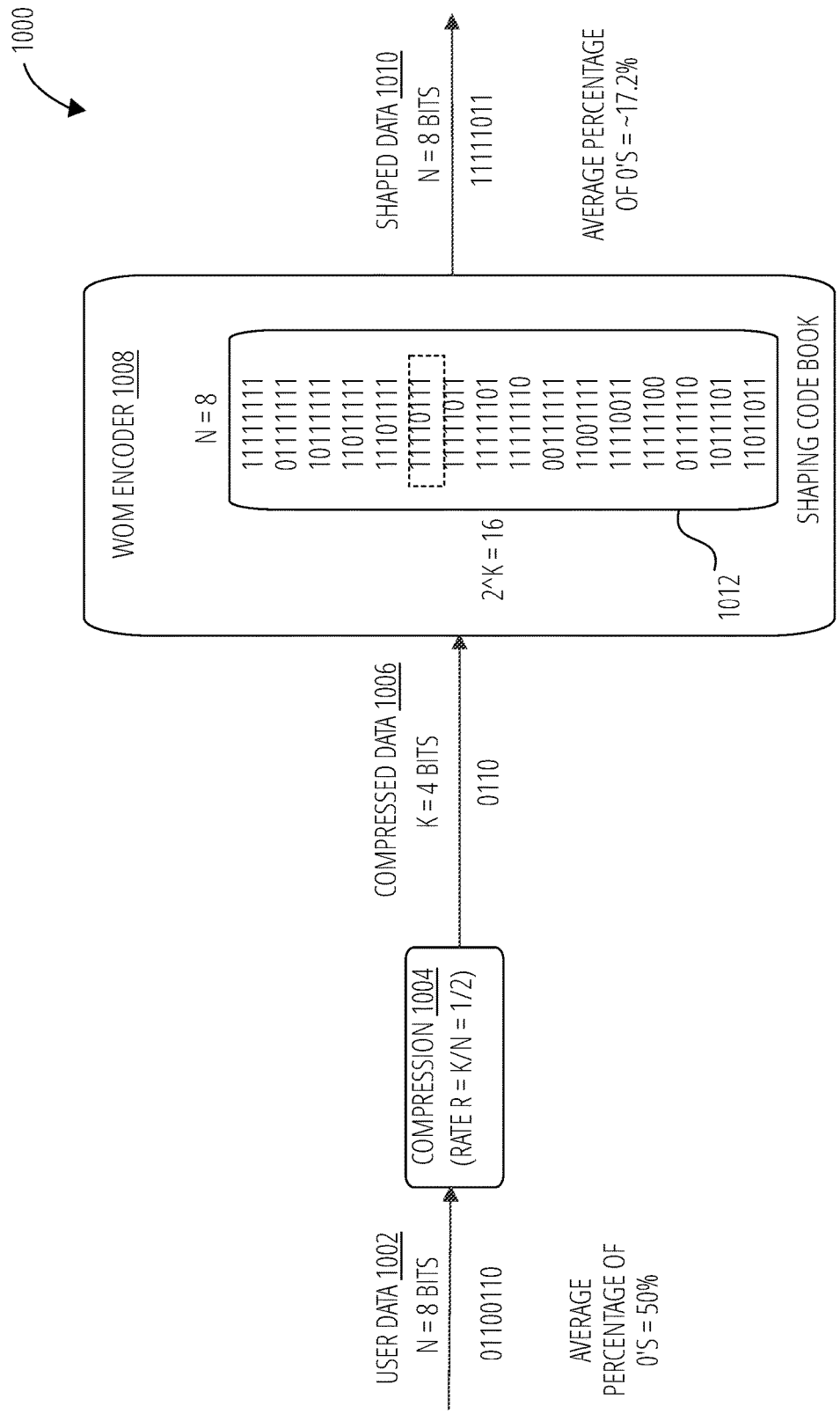
FIG. 10 illustrates a compression-expansion approach 1000 in accordance with one embodiment.

FIG. 10 illustrates a compression-expansion approach 1000 that demonstrates how compression and shaping may facilitate use of WOM coding as disclosed herein. In this embodiment, n=8 bits of user data 1002 may undergo compression 1004 at a rate of r=1/2, resulting in k=4 bits of compressed data 1006. In this depiction, the original user data 1002 may tend to comprise 50% 0's, ideally (this may be unlikely in practice). The WOM encoder 1008 transforms the compressed data 1006 by expanding it back to eight bits by selecting an entry from a shaping code book 1012 may result, as shown, in eight bits of shaped data 1010. Where the user data 1002 contained four 0's out of eight bits (50% 0's), the expanded and shaped data may contain only a single 0, for an average percentage of ~17.2%.

Reducing the number of 0's allows for fewer memory SET operations, which require more time than memory RESET operations. Fewer 0's written also allows for more degrees of freedom when writing the next data sequence to be written. Writing the next data sequence will apply WOM coding, such that it SETs and additional (preferably minimal) set of memory cells to 0's. This allows for more writes across a single memory sector before a complete reset is needed, reducing overall latency for PCM memory WRITE operations.

Figure 11:
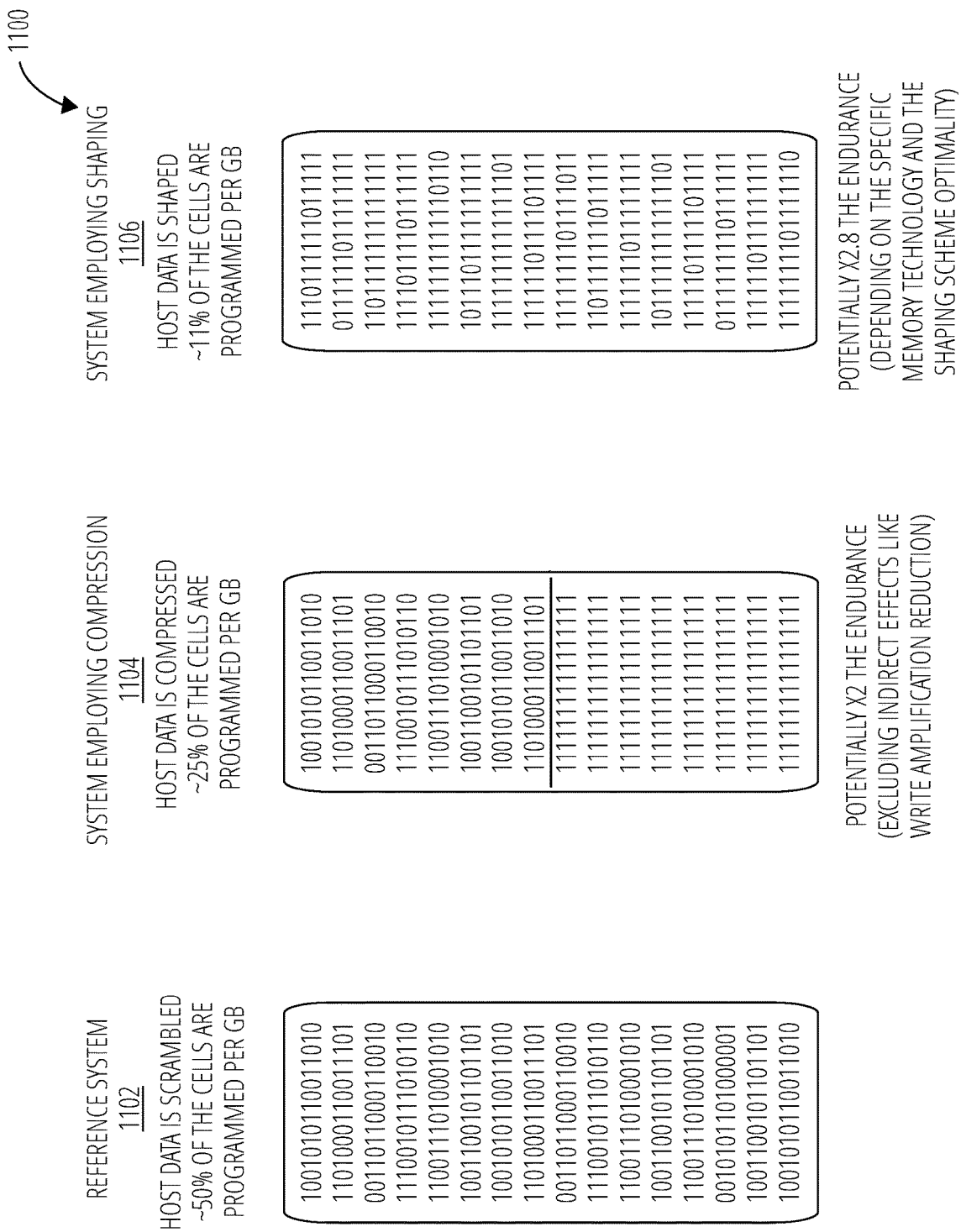
FIG. 11 illustrates shaping versus compression comparison 1100 in accordance with one embodiment in which the data is assumed to be compressible by 50%.

FIG. 11 depicts a shaping versus compression comparison 1100, with regard to improving storage class memory endurance (e.g., reducing SET operations and complete RESET operation cycles, reducing cell wearing, incurring fewer disturb effects, etc.). This example assumes a compression rate of r=1/2 and a shaping level $p=H_b^{-1}(r)=0.11$. This shaping level is based on a binary entropy function $H_b$ (implementations of which are known in the art) and assumes an optimal shaping scheme.

In this embodiment, a reference system 1102 contains host data that is scrambled. Approximately 50% of cells may be programmed or SET per each GB of data. A system employing compression 1104 may compress host data into half the bytes. The smaller data set itself may still be 50% 0's, but it may be written, as shown, into half the space, leaving all 1's in the unused space. Thus the overall percentage of 0's for the original GB size is now 25%. Without considering indirect effects such as write amplification reduction, this may provide twice the endurance.

However, a system employing shaping 1106 may further improve upon this. As is show, expanding the data back out to its original size and employing a shaping method, a representation of the original data may be found that involves programming only 11% of the cells per GB of data. This may yield 2.8 times the endurance, depending on the specific memory technology and the optimality of the shaping scheme.

Figure 12:
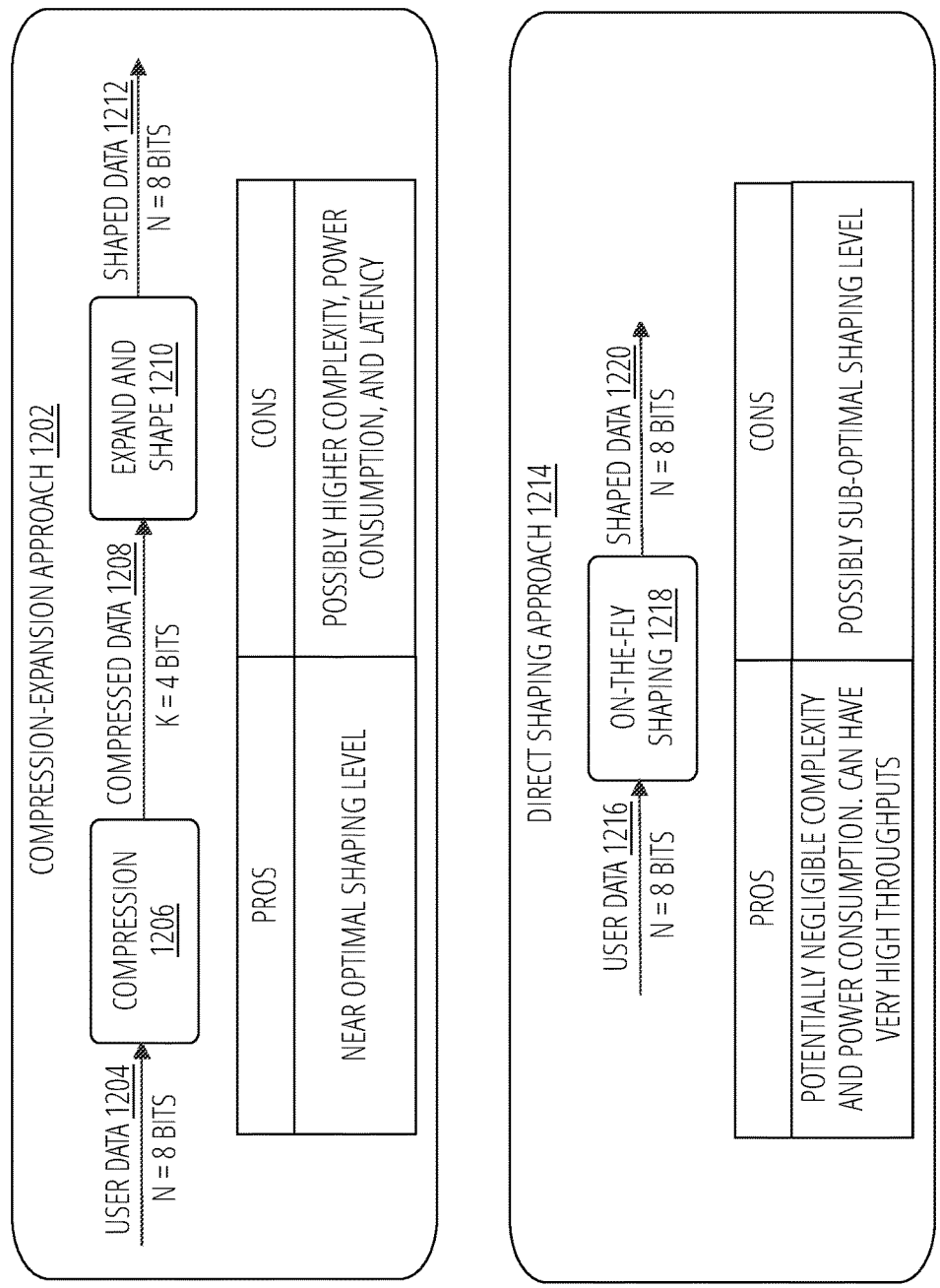
FIG. 12 illustrates an approach comparison 1200 in accordance with one embodiment.

FIG. 12 depicts an approach comparison 1200 of the compression-expansion approach 1202 and the direct shaping approach 1214.

The compression-expansion approach 1202 is a two stage approach. In this example, four bits of compressed data 1208 are created by passing eight bits of user data 1204 through a compression 1206 stage. The compression 1206 stage may use a lossless compression algorithm, such as LZ compression. The compressed data 1208 is then passed through an expand and shape 1210 stage to form eight bits of shaped data 1212. Expansion may use a shaping code, such as Adaptive Reverse Huffman/Run-Length.

The compression-expansion approach 1202 may enable data to closely approach the theoretical shaping limit. Potential downsides of compression-expansion approach 1202 are that it may require high complexity, high power consumption, and a large latency due to the need to support variable compression-expansion rates.

The direct shaping approach 1214 is a single stage approach. The eight bits of compressible user data 1216 may be directly transformed through on-the-fly shaping 1218 to eight bits of shaped data 1220. This approach may be implemented with negligible complexity and power consumption, and may be performed with very high throughputs. The downside of the direct shaping approach 1214 is that it may achieve a lower shaping level than the theoretical limit.

Figure 13:
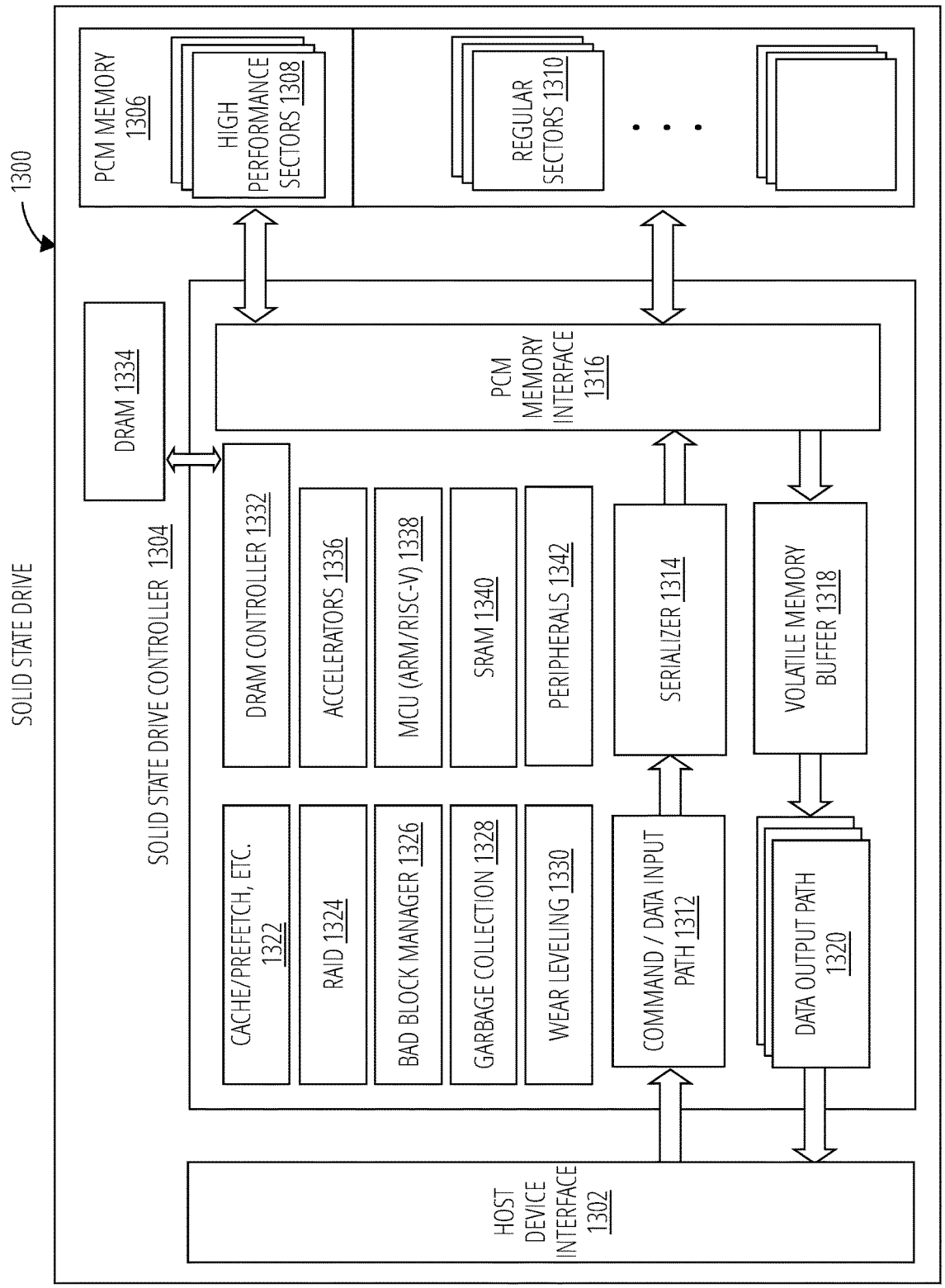
FIG. 13 illustrates a solid state drive 1300 in accordance with one embodiment.

Referring to FIG. 13, a solid state drive 1300 comprises a host device interface 1302, a controller 1304, a PCM memory 1306, and a DRAM 1334. The controller 1304 may include a command/data input path 1312, a serializer 1314, a PCM memory interface 1316, a volatile memory buffer 1318, a data output path 1320, a cache/prefetch, etc. 1322, a RAID 1324, a bad block manager 1326, a garbage collection 1328, a wear leveling 1330, a DRAM controller 1332, accelerators 1336, an MCU (ARM/RISC-V) 1338, an SRAM 1340, and peripherals 1342. The PCM memory 1306 may include a high performance partition sectors 1308. The PCM memory 1306 may include high performance partition sectors 1308 and regular partition sectors 1310. The solid state drive 1300 is thus an example of an embodiment in which a central controller 1304 may implement the compression, expansion, and shaping tasks disclosed herein.

The controller 1304 may have a one ASIC or two-chip architecture (front end chip and backend chip) with proper function partitioning.

The PCM memory 1306 may receive processed data from the PCM memory interface 1316 and return a data output. The PCM memory 1306 may include logic to determine which of the NAND gate groups to utilize to generate the data outputs, which are sent to the PCM memory interface 1316. The solid state drive 1300 may receive a command (or control signal) at the host device interface 1302, which is then received at the command/data input path 1312.

The host device interface 1302 prioritizes which of the physical layers to utilize during a data or command transfer to the host device. The host device interface 1302 may be configured by the data output path 1320 regarding delays in sending and reporting sent and received data and commands. The host device interface 1302 further sends incoming data for NAND processing to the command/data input path 1312.

The command/data input path 1312 receives data for NAND processing from the host device interface 1302. The data is then sent to a serializer 1314. The command/data input path 1312 further sends control signals regarding workload to a latency estimate logic. The workload attributes may include percentage read, a queue depth, a percentage random, a transfer length, an initiator count, a port count, and input/outputs per second (IOPS).

The serializer 1314 receives the data from the command/data input path 1312. The serializer 1314 performs the process of translating data structures or object state into a format that can be stored (for example, in a file or memory buffer) or transmitted (for example, across a network connection link) and reconstructed later (possibly in a different computer environment). Such a control signal may influence the flash translation layer queue depth. The processed data is then sent to the PCM memory interface 1316. In some embodiments, the processed data alters the flash translation layer queue depth of the PCM memory interface 1316, altering the number of commands the PCM memory interface 1316 is concurrently processing.

The PCM memory interface 1316 receives the processed data as well as the control signal to determine the flash translation layer queue depth. The PCM memory interface 1316 may interact via control signals to determine the address to send data and commands to the PCM memory 1306 and the volatile memory buffer 1318. The PCM memory interface 1316 may then send data and commands to the PCM memory 1306 and the volatile memory buffer 1318. The PCM memory interface 1316 also receives the data outputs from the PCM memory 1306.

An indirection table stores address locations for various components of the solid state drive 1300 to be utilized by the PCM memory interface 1316.

The volatile memory buffer 1318 may send and receive data (processed data, data outputs, etc.) from the PCM memory interface 1316 and the data output path 1320. The volatile memory buffer 1318 is a region of a physical memory storage used to temporarily store data while it is being moved from one place to another. For example, the volatile memory buffer 1318 may store processed data that is not actively queued in the PCM memory interface 1316 and send further processed data upon request by the PCM memory interface 1316. The PCM memory interface 1316 may perform a similar process for data outputs for the data output path 1320.

The data output path 1320 determines the scheduling of host device data transfers (e.g., of data outputs) and the scheduling of host device responses. The data output path 1320 communicates with the host device interface 1302 to send and receive this data and commands. The data output path 1320 may be altered by the control signals to delay the data transfers or the response frames. The data output path 1320 may send control signals regarding workload to a latency estimate logic. The workload attributes may include percentage read, a queue depth, a percentage random, a transfer length, an initiator count, a port count, and input/outputs per second (IOPS).

The cache/prefetch, etc. 1322, the RAID 1324, the bad block manager 1326, the garbage collection 1328, and the wear leveling 1330 are firmware stored in the controller 1304. This firmware may perform various operations on the solid state drive 1300. The DRAM controller 1332, the accelerators 1336, the MCU (ARM/RISC-V) 1338, the SRAM 1340, and the peripherals 1342 may be part of an application-specific integrated circuit (ASIC) on the controller 1304 designed for a special application, such as a particular kind of transmission protocol or a hand-held computer. The DRAM controller 1332 may interface with the DRAM 1334.

The solid state drive in this disclosure is described in the preceding on the basis of several preferred embodiments. Different aspects of different variants are considered to be described in combination with each other such that all combinations that upon reading by a skilled person in the field on the basis of this document may be regarded as being read within the concept of the invention. The preferred embodiments do not limit the extent of protection of this document.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

Having thus described illustrative embodiments in detail, it will be apparent that modifications and variations are possible without departing from the scope of the invention as claimed.

What is claimed is:

1. A solid state drive comprising:
a memory comprising asymmetric command latency characteristics for WRITE operations comprising data;
logic to direct the WRITE operations to memory sectors to which WOM coding is applied, based on the data satisfying a compression threshold level and a memory latency performance improvement target for the WRITE operations.

2. The solid state drive of claim 1, wherein the WOM coding is configured to minimize a number of SET operations needed program the data in the memory.

3. The solid state drive of claim 1, further comprising logic to allocate a size of the memory sectors based on an overprovisioning requirement associated with the memory latency performance improvement target.

4. The solid state drive of claim 1, further comprising logic to direct the WRITE operations to the memory sectors on condition that the data has a compressibility ratio satisfying a configured threshold level.

5. The solid state drive of claim 4, further comprising logic to allocate a dedicated memory partition to which to apply the WOM coding.

6. The solid state drive of claim 1, further comprising logic to:
direct the WRITE operations to the memory sectors based on a comparison of a compressibility ratio of the data and an overprovisioning requirement of the WOM coding.

7. The solid state drive of claim 6, further comprising logic to apply compression to the data before shaping the data for the WOM coding.

8. The solid state drive of claim 7, further comprising logic to direct the WRITE operations to particular memory sectors based on a comparison of the overprovisioning requirement and a data size reduction obtained by applying compression to the data.

9. An apparatus comprising:
a memory comprising asymmetric command latency characteristics for WRITE operations comprising data; and
a controller configured to:
apply WOM coding when writing the data based on the data satisfying a compression threshold level; and
otherwise not apply the WOM coding.

10. The apparatus of claim 9, the controller further configured to allocate memory sectors for the WRITE operation based on a compression efficiency of the data.

11. The apparatus of claim 10, the controller further configured to direct the WRITE operations to the memory sectors on condition that the data has a compressibility ratio satisfying the compression threshold level.

12. The apparatus of claim 11, the controller further configured to apply compression to the data, followed by data shaping.

13. The apparatus of claim 9, the controller further configured to direct the WRITE operations to particular memory sectors based on a performance improvement target for the data.

14. The apparatus of claim 13, wherein the memory is a phase change memory.

15. The apparatus of claim 9, the controller further configured to direct the WRITE operations to particular memory sectors based on a comparison of an overprovisioning requirement and a data size reduction obtained by applying compression to the data.

16. A memory device comprising:
asymmetric command latency memory means; and
means to apply WOM coding to configured memory sectors of the memory means based on the data satisfying a compression threshold level and a memory latency performance improvement target for WRITE operations.

17. The memory device of claim 16, further comprising means to allocate a size of the memory sectors based on an overprovisioning requirement associated with the memory latency performance improvement target.

18. The memory device of claim 16, further comprising means to direct the WRITE operations to the memory sectors on condition that data of the WRITE operations has a compressibility ratio satisfying a configured threshold level.

19. The memory device of claim 16, further comprising means to allocate the memory sectors for the WRITE operations based on a compression efficiency of data of the WRITE operations.

20. The memory device of claim 16, further comprising means to apply compression to data of the WRITE operations, followed by data shaping.

* * * * *